US012796338B2

(12) United States Patent
Hinderling et al.

(10) Patent No.: US 12,796,338 B2
(45) Date of Patent: Nov. 10, 2026

(54) CONTROLLABLE QUBIT DEVICE WITH A SINGLE JOSEPHSON JUNCTION

(71) Applicant: INTERNATIONAL BUSINESS MACHINES CORPORATION, Armonk, NY (US)

(72) Inventors: Manuel Luca Hinderling, Marbach (CH); Daniel Zachary Haxell, Zürich (CH); Fabrizio Nichele, Zürich (CH)

(73) Assignee: International Business Machines Corporation, Armonk, NY (US)

(*) Notice: Subject to any disclaimer, the term of this patent is extended or adjusted under 35 U.S.C. 154(b) by 1000 days.

(21) Appl. No.: 18/066,513

(22) Filed: Dec. 15, 2022

(65) Prior Publication Data

US 2025/0393482 A1 Dec. 25, 2025

(51) Int. Cl.

| | |
|---|---|
| ***H10N 60/80*** | (2023.01) |
| ***G06N 10/40*** | (2022.01) |
| ***H10N 60/12*** | (2023.01) |
| ***H10N 60/83*** | (2023.01) |
| ***H10N 69/00*** | (2023.01) |

(52) U.S. Cl.

CPC ........... *H10N 60/805* (2023.02); *G06N 10/40* (2022.01); *H10N 60/12* (2023.02); *H10N 60/83* (2023.02); *H10N 69/00* (2023.02)

(58) Field of Classification Search

None

See application file for complete search history.

(56) References Cited

U.S. PATENT DOCUMENTS

| | | | |
|---|---|---|---|
| 6,154,026 A | 11/2000 | Dantsker et al. | |
| 11,664,804 B1 * | 5/2023 | Epstein .......... | H03K 19/017545 327/528 |
| 2003/0071258 A1 * | 4/2003 | Zagoskin ............. | H10N 60/124 380/278 |
| 2005/0045872 A1 | 3/2005 | Newns et al. | |
| 2010/0085827 A1 | 4/2010 | Thom et al. | |
| 2018/0013052 A1 * | 1/2018 | Oliver .................. | H10N 60/805 |
| 2018/0054201 A1 | 2/2018 | Reagor et al. | |
| 2021/0091062 A1 * | 3/2021 | Boothby ................ | H05K 1/184 |

FOREIGN PATENT DOCUMENTS

WO 2022/058025 A1 3/2022

OTHER PUBLICATIONS

Hays, et al., "Coherent manipulation of an Andreev spin qubit", Science [journal], Jan. 17, 2021, 17 pages, vol. 373, No. 6553, American Association for the Advancement of Science ({AAAS}), arXiv:2101.06701v1 [cond-mat.mes-hall], DOI: 10.1126/science.abf0345, Retrieved from the Internet: <URL: https://arxiv.org/abs/2101.06701>.

(Continued)

*Primary Examiner* — Hung K Vu

(74) *Attorney, Agent, or Firm* — Harrity & Harrity, LLP

(57) ABSTRACT

The present disclosure relates to a qubit device comprising a first superconducting loop containing one Josephson junction, and a second superconducting loop having an inductance higher than an inductance of the first superconducting loop.

20 Claims, 5 Drawing Sheets

(56) References Cited

OTHER PUBLICATIONS

Peiselt, et al., "High-Tc dc-SQUID gradiometers in flip-chip configuration", Superconductor Science and Technology [article], Nov. 2003, 6 pages, vol. 16, No. 12, Retrieved from the Internet: <URL: https://iopscience.iop.org/article/10.1088/0953-2048/16/12/019>.

Pita-Vidal, et al., "Gate-Tunable Field-Compatible Fluxonium", Phys. Rev. Applied [journal], Dec. 2020, 12 pages, vol. 14, Issue 6, American Physical Society, DOI: 10.1103/PhysRevApplied.14.064038, Retrieved from the Internet: <URL: https://journals.aps.org/prapplied/abstract/10.1103/PhysRevApplied. 14.064038>.

* cited by examiner

CONTROLLABLE QUBIT DEVICE WITH A SINGLE JOSEPHSON JUNCTION

BACKGROUND

The present invention relates to the field of digital computer systems, and more specifically, to a tunable qubit device with a Josephson junction.

In order to function as a qubit, a Josephson-junction qubit design may provide at least two states in the local minimum of the potential energy. However, readout of the qubit state may require that a superconducting loop of the Josephson junction qubit device needs to be large. However, this may render the design sensitive to fluctuations in external magnetic fields.

SUMMARY

Various embodiments provide a method and qubit device as described by the subject matter of the independent claims. Advantageous embodiments are described in the dependent claims. Embodiments of the present invention can be freely combined with each other if they are not mutually exclusive.

In one aspect, the invention relates a qubit device comprising a first superconducting loop containing one Josephson junction, and a second superconducting loop having an inductance higher than an inductance of the first superconducting loop.

In one aspect, the invention relates to a method of using a qubit device for performing quantum computing, the qubit device comprising: a first superconducting loop containing one Josephson junction, and a second superconducting having an inductance higher than an inductance of the first superconducting loop.

BRIEF DESCRIPTION OF THE DRAWINGS

In the following embodiments of the invention are explained in greater detail, by way of example only, making reference to the drawings in which.

DETAILED DESCRIPTION

Figure 1:
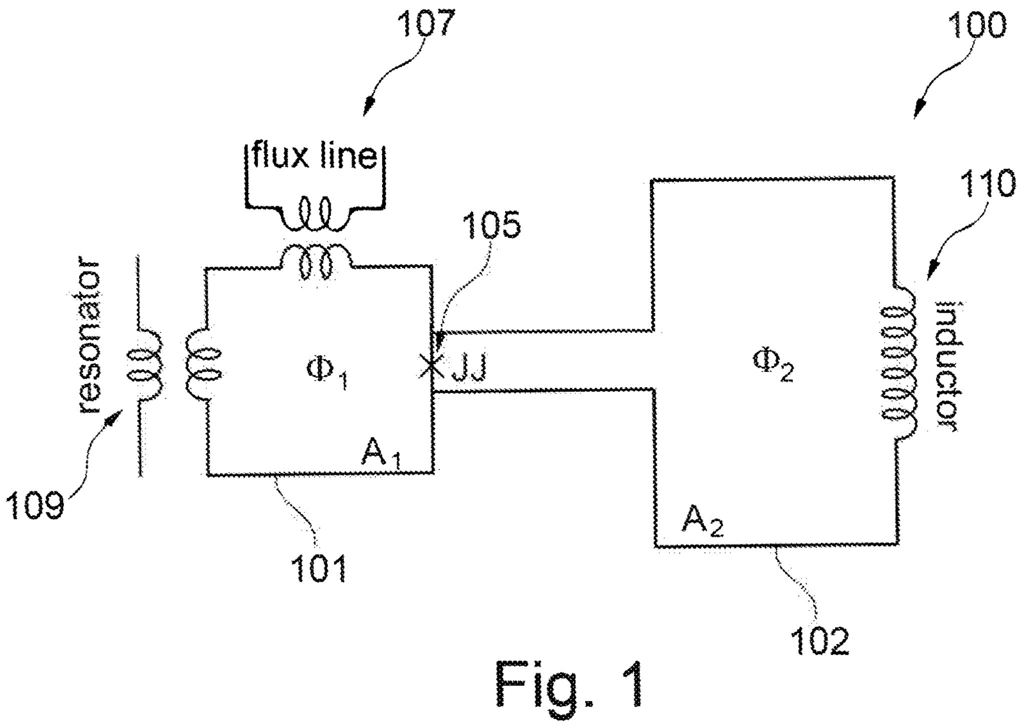
FIG. 1 depicts a circuit diagram showing an equivalent circuit for a qubit device according to an example of the present subject matter.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

A quantum integrated circuit (or quantum circuit) may comprise one or more devices such as a qubit device and a coupler device. A device of the quantum circuit may be sensitive to noises such as global magnetic field noise. In particular, a single Josephson junction device may be very sensitive to the global magnetic field noise. For example, the operating frequency of the device may depend on the magnetic flux through the device, which magnetic flux may be induced by the global magnetic field noise.

The present subject matter may mitigate the effect of the global magnetic field noise in a qubit device. Instead of using multiple Josephson junctions in order to reduce the effect of the fluctuation of the external magnetic field, the present subject matter may keep a single Josephson junction. In particular, the qubit device may comprise a first superconducting loop containing a single Josephson junction, and a second superconducting loop including an inductor of a higher inductance in parallel with the Josephson junction. The qubit device may comprise the first superconducting loop containing the single Josephson junction, and the second superconducting having an inductance higher than an inductance of the first superconducting loop. Providing an additional and higher inductance by the second loop may enable to control the effect of the global magnetic field noise. The design of the present qubit device may further be advantageous as it may be used in a scalable and controllable way, necessary for the transition from an emerging research area to an established and integrated technology. The qubit device may, for example, be a flux qubit device. E.g., the qubit device may have a gradiometric design. Since the inductance in the second superconducting loop is higher than the inductance in the first superconducting loop, the qubit device may be said as having an asymmetric gradiometric loop design, where the asymmetry is defined by the difference in the inductances. The asymmetric gradiometric loop design may potentially be applied to any inductively coupled qubit type which requires a low inductance loop. The present subject matter may enable to couple easily to a low inductance loop with suppressed magnetic field noise. The qubit device design may allow inductive coupling of microwave resonators to a qubit based on Andreev states, whilst suppressing global magnetic field noise.

The first superconducting loop may be a circuit loop. The circuit loop may refer to a closed path that begins at a node, travels through one or more elements, and returns to the same starting node without the path crossing itself. The circuit node may be a point of connection between two or more circuit elements. The first superconducting loop may enclose a magnetic flux $\Phi_1$. For example, when the first superconducting loop is put in an external magnetic field, the magnetic flux $\Phi_1$ through the first superconducting loop may be quantized being equal to the integer number $n_1$ of the flux quanta $\Phi_0$ as follows: $\Phi_1=n_1\Phi_0$. The operation of the first superconducting loop may be based on the fact that the phase difference around the first superconducting loop may be an integral product of $2e\Phi_1/\hbar$, e being the electron charge and $\hbar$ is the reduced Planck constant. The current may vary with $\Phi_1$ and has maxima at $$\frac{e\Phi_1}{\hbar} = \pi n_1.$$

The Josephson junction may have an inductance referred to as $L_q$. The first superconducting loop may have an inductance (first inductance) referred to as $L_1$. The first superconducting loop may have an area referred to as first area $A_1$. The first inductance $L_1$ may be equal to the sum of the geometric inductance $L_{G,1}$ and the kinetic inductance $L_{K,1}$ i.e., $L_1=L_{K,1}+L_{G,1}$. Alternatively, the first inductance $L_1$ may be equal to the kinetic inductance $L_{K,1}$, i.e., $L_1=L_{K,1}$, assuming that the geometric inductance $L_{G,1}$ is negligeable compared to the kinetic inductance $L_{K,1}$ e.g., the difference between the kinetic inductance $L_{K,1}$ and the geometric inductance $L_{G,1}$ is higher than a maximum difference, e.g., $L_{G,1}<<L_{K,1}$. The geometric inductance refers to an inductance that is due to the geometric pattern of the circuit.

The second superconducting loop may be a circuit loop. The second superconducting loop may enclose a magnetic flux $\Phi_2$. For example, when the second superconducting loop is put in an external magnetic field, the magnetic flux $\Phi_2$ through the loop may be quantized being equal to the integer number $n_2$ of the flux quanta $\Phi_0$ as follows: $\Phi_2=n_2\Phi_0$. The operation of the second superconducting loop may be based on the fact that the phase difference around the first superconducting loop may be an integral product of $2e\Phi_2/\hbar$, e being the electron charge and $\hbar$ is the reduced Planck constant. The current may vary with $\Phi_2$ and has maxima at $$\frac{e\Phi_2}{\hbar} = \pi n_2.$$

The second superconducting loop may have an inductance (second inductance) referred to as $L_2$. The second superconducting loop may have an area referred to as second area $A_2$. The second inductance $L_2$ may be equal to the sum of the geometric inductance $L_{G,2}$ and the kinetic inductance $L_{K,2}$ i.e., $L_2=L_{K,2}+L_{G,2}$. Alternatively, the second inductance $L_2$ may be equal to the kinetic inductance $L_{K,2}$, i.e., $L_2=L_{K,2}$, assuming that the geometric inductance $L_{G,2}$ is negligeable compared to the kinetic inductance $L_{K,2}$ e.g., the difference between the kinetic inductance $L_{K,2}$ and the geometric inductance $L_{G,2}$ is higher than the maximum difference, e.g., $L_{G,2}<<L_{K,2}$.

The second inductance $L_2$ may be provided higher than the first inductance $L_1$ by adjusting the kinetic inductance $L_{K,2}$ and/or adjusting the geometric inductance $L_{G,2}$ for a fixed/provided value of the first inductance $L_1$. The adjusting of the kinetic inductance $L_{K,2}$ may be performed, for example, by using an array of Josephson junctions, by extending the length of the loop, or by including high kinetic inductance materials in the second superconducting loop.

The present subject matter may enable an optimal control of the external magnetic field effect on the qubit device by using different advantageous relations between the first area $A_1$ and the second area $A_2$ and/or relations between the first inductance $L_1$ and the second inductance $L_2$. The present subject matter may provide an asymmetric gradiometric qubit device with a single Josephson junction.

According to one example, the second inductance $L_2$ of the second superconducting loop is higher than the first inductance $L_1$ of the first superconducting loop, $L_2>L_1$. Having a smaller inductance at the first superconducting loop may enable the first superconducting loop to be strongly inductively coupled with a readout resonator or a control flux line, because the coupling strength scales with the inverse of the inductance of the first superconducting loop. According to one example, the first superconducting loop is configured to inductively couple to a readout resonator and/or to inductively couple to control lines. The first superconducting loop may be configured to inductively couple to the readout resonator and/or to inductively couple to the control lines via a gap between two chips. The control lines may be used to modify the state of the Josephson junction by applying a microwave drive pulse with a center frequency that matches the operating frequency of the qubit device. The control lines may further be used to dynamically tune the operating frequency of the qubit device or tune the phase across the Josephson junction. The readout resonator may be used to monitor the state of the Josephson junction via microwave measurements.

According to one example, the first inductance $L_1$ of the first superconducting loop is smaller than the inductance of the Josephson junction $L_q$, $L_1<L_q$. This example may be advantageous as it may enable to achieve full phase tuning of the qubit states in the Josephson junction.

According to one example, the second inductance $L_2$ of the second superconducting loop is higher than the inductance of the Josephson junction, $L_2>L_q$. This example may be advantageous as it may enable to integrate the present subject matter in a gradiometric design. With at least one loop of the qubit device having a higher inductance than the Josephson junction, the qubit states in the Josephson junction may still be accessible via the coupled readout resonator or control lines.

For example, there is a first offset value $\delta_1$ between the first inductance and the inductance of the Josephson junction, $L_q=L_1+\delta_1$. For example, there is a second offset value $\delta_2$ between the second inductance and the inductance of the Josephson junction, $L_q=L_2-\delta_2$. Determining the parameters of the qubit device that mitigate the effect of the external magnetic field noise may comprise determining the offset values $\delta_1$ and $\delta_2$. In one example, the first offset value $\delta_1$ may be higher than a minimum threshold so that the inductance $L_q$ may be much higher than the first inductance $L_1$, $L_1<<L_q$. In one example, the second offset value $\delta_2$ may be higher than a minimum threshold so that the inductance $L_q$ may be much smaller than the second inductance $L_2$, $L_2>>L_q$. In one example, the first offset value $\delta_1$ may be a user defined value. In one example, the second offset value $\delta_2$ may be a user defined value. Alternatively, the first offset value $\delta_1$ and second offset value $\delta_2$ may be determined using an analytical computation or by using a simulation method.

The following describes an example of the analytical computation assuming that the geometric inductance is negligeable and thus the inductance is equal to the kinetic inductance, that is $L_1=L_{K,1}$ and $L_2=L_{K,2}$. The phase $\varphi_{K,1}$ induced from the first inductance $L_{K,1}$ of the first superconducting loop may be defined as follows:

$$\varphi_{K,1} = \frac{2\pi}{\Phi_0} L_{K,1} I_1,$$

where $I_1$ is the current circulating in the first superconducting loop. The phase $\varphi_{K,2}$ induced from the second inductance $L_{K,2}$ of the second superconducting loop may be defined as follows:

$$\varphi_{K,2} = \frac{2\pi}{\Phi_0} L_{K,2} I_2,$$

where $I_2$ is the current circulating in the second superconducting loop. The phase $\varphi_q$ induced from the inductance $L_q$ of the Josephson junction may be defined as follows:

$$\varphi_q = \frac{2\pi}{\Phi_0} L_q I_3,$$

where $I_3$ is the current flowing through the Josephson junction. The qubit device may be provided so that the current conservation at the qubit device is defined as follows: $I_1=I_2+I_3$. The magnetic flux quantisation in the first superconducting loop may thus be defined using the phases $\varphi_{K,1}$ and $\varphi_q$ as follows:

$$2\pi\frac{\Phi_1}{\Phi_0} - \varphi_{K,1} - \varphi_q = 2\pi n_1.$$

Similarly, the magnetic flux quantisation in the second superconducting loop may be defined using the phases $\varphi_{K,2}$ and $\varphi_q$ as follows:

$$2\pi\frac{\Phi_2}{\Phi_0} - \varphi_{K,2} + \varphi_q = 2\pi n_2.$$

Hence, a combination of the above definitions may result in the following definition of the phase $\varphi_q$ across the Josephson junction:

$$\varphi_q = \frac{\frac{2\pi}{\Phi_0}\left(\Phi_1 - \frac{L_{K,1}}{L_{K,2}}\Phi_2\right) - 2\pi\left(n_1 - \frac{L_{K,1}}{L_{K,2}}n_2\right)}{\frac{L_{K,1}}{L_q} + \left(1 + \frac{L_{K,1}}{L_{K,2}}\right)}.$$

A global field variation $\Delta B$ may cause a variation $\Delta\varphi_q$ in the phase across the Josephson junction. The variation $\Delta\varphi_q$ in the phase across the Josephson junction may be defined as follows:

$$\Delta\varphi_q = \frac{\frac{2\pi}{\Phi_0}\Delta B\left(A_1 - \frac{L_{K,1}}{L_{K,2}}A_2\right)}{\frac{L_{K,1}}{L_q} + \left(1 + \frac{L_{K,1}}{L_{K,2}}\right)},$$

where $\Phi_1=B\cdot A_1$, $\Phi_2=B\cdot A_2$, and B is the external magnetic field. Thus, according to one example, the qubit device may be configured so that the phase variation across the Josephson junction $\Delta\varphi_q$ is equal to zero or close to zero, wherein the phase variation across the Josephson junction $\Delta\varphi_q=0$ may be obtained by having the ratio of the first area and the second area equal to the ratio of the first inductance and the second inductance, that is $$\frac{A_1}{A_2} = \frac{L_{K,1}}{L_{K,2}}.$$

The analytical computation may thus enable to define the inductance of the second superconducting loop as follows: $L_{K,2}=L_{K,1}+\delta_1+\delta_2$, where $$\delta_1 + \delta_2 = \left(\frac{A_2 - A_1}{A_2}\right)\cdot L_{K,1}.$$

In other words, by knowing the areas $A_1$ and $A_2$ of the first and second conducting loops and the first inductance $L_{K,1}$, the present subject matter may enable to obtain an optimal value of the second conductance $L_{K,2}$ that enables mitigation of the effect of the external magnetic field. Additionally, and assuming that $L_{K,2}>>L_{K,1}$, the phase $\varphi_q$ induced from the Josephson junction may become:

$$\varphi_q \approx \frac{\frac{2\pi}{\Phi_0}\Phi_1 - 2\pi n_1}{\frac{L_{K,1}}{L_q} + 1}.$$

This analytical computation result may impose that $$\frac{L_{K,1}}{L_q} << 1$$

so that the full phase tuning may be performed.

The following describes an example of the analytical computation for determining values of the inductance in a qubit device according to the present subject matter. The qubit device (e.g., as shown in FIG. 1) comprises a first superconducting loop having a Josephson junction. The qubit device comprises a second superconducting loop. The first superconducting loop may enclose a magnetic flux $\Phi_1$. For example, when the first superconducting loop is put in an external magnetic field the magnetic flux $\Phi_1$ through the loop may be quantized being equal to the integer number of the flux quanta $\Phi_0$ as follows: $\Phi_1=n_1\Phi_0$. The phase $\varphi_1$ induced from the first inductance $L_1$ of the first superconducting loop may be defined as follows:

$$\varphi_1 = \frac{2\pi}{\Phi_0} L_1 I_1,$$

where $I_1$ is the current circulating in the first superconducting loop and $L_1=L_{K,1}+L_{G,1}$. The phase $\varphi_1$ may be defined as follows $\varphi_1=\varphi_{K,1}+\varphi_{G,1}$ where $\varphi_{K,1}$ is the phase induced from the kinetic inductance $$L_{K,1},\ \varphi_{K,1} = \frac{2\pi}{\Phi_0} L_{K,1} I_1 \text{ and } \varphi_{G,1}$$

is the phase induced from the geometric inductance $$L_{G,1},\ \varphi_{G,1} = \frac{2\pi}{\Phi_0}(L_{G,1} I_1 \text{ and } M I_3),$$

where M is the mutual inductance between the first and second loops. The phase $\varphi_2$ induced from the second inductance $L_2$ of the second superconducting loop may be defined as follows:

$$\varphi_2 = \frac{2\pi}{\Phi_0} L_2 I_2,$$

where $I_2$ is the current circulating in the second superconducting loop and $L_2 = L_{K,2} + L_{G,2}$. The phase $\varphi_2$ may be defined as follows $\varphi_2 = \varphi_{K,2} + \varphi_{G,2}$, where $\varphi_{K,2}$ is the phase induced from the kinetic inductance $$L_{K,2},\ \varphi_{K,2} = \frac{2\pi}{\Phi_0} L_{K,2} I_2 \text{ and } \varphi_{G,2}$$

is the phase induced from the geometric inductance $$L_{G,2},\ \varphi_{G,2} = \frac{2\pi}{\Phi_0}(L_{G,2} I_2 \text{ and } M I_3).$$

The phase $\varphi_q$ induced from the inductance $L_q$ of the Josephson junction may be defined as follows:

$$\varphi_q = \frac{2\pi}{\Phi_0} L_q I_3,$$

where $I_3$ is the current flowing through the Josephson junction. The qubit device may be provided so that the current conservation at the qubit device is defined as follows: $I_1 = I_2 + I_3$. The magnetic flux quantisation in the first superconducting loop may thus be defined using the phases $\varphi_1$ and $\varphi_q$ as follows:

$$2\pi\frac{\Phi_1}{\Phi_0} - \varphi_1 - \varphi_q = 2\pi n_1.$$

Similarly, the magnetic flux quantisation in the second superconducting loop may be defined using the phases $\varphi_2$ and $\varphi_q$ as follows:

$$2\pi\frac{\Phi_2}{\Phi_0} - \varphi_2 + \varphi_q = 2\pi n_2.$$

Using the above equations, the phase $\varphi_q$ induced from the inductance $L_q$ of the Josephson junction may be defined as follows:

$$\varphi_q = \frac{\frac{2\pi}{\Phi_0}(\Phi_1 - \alpha\Phi_2) - 2\pi(n_1 - \alpha n_2)}{(1+\alpha)\left(1 + \frac{L_1}{L_q}\left(1 + \alpha\frac{M}{L_1}\right)\left(1 - \beta\frac{L_1}{L_2}\right)\right)},$$

where $$\alpha = \frac{L_1 - M}{L_2 - M} \text{ and } \beta = \frac{1 - M/L_1}{1 + \frac{L_1}{L_2} - \frac{2M}{L_2}}.$$

A global field variation $\Delta B$ may cause a variation $\Delta\varphi_q$ in the phase across the Josephson junction. The variation in the phase across the Josephson junction may be defined as follows:

$$\Delta\varphi_q = \frac{\frac{2\pi}{\Phi_0}\Delta B(A_1 - \alpha A_2)}{(1+\alpha)\left(1 + \frac{L_1}{L_J}\left(1 + \alpha\frac{M}{L_1}\right)\left(1 - \beta\frac{L_1}{L_2}\right)\right)}.$$

The qubit device may be configured so that the phase variation across the Josephson junction $\Delta\varphi_q$ is equal to zero, where $\Delta\varphi_q = 0$ for $$\frac{A_1}{A_2} = \alpha.$$

Thus, the effect of reducing the global magnetic field noise may be obtained by a large asymmetry in the total inductance. Also, the effect may be obtained for a large asymmetry in the geometric inductance only. And, in the case of a negligible geometric conductance, meaning that $L_{G,1}$ $L_{G,2}$ and M tend to zero, the effect may be obtained for a large asymmetry in the kinetic inductance. This analytical computation may thus be used to adjust the kinetic inductance $L_{K,2}$ and/or adjust the geometric $L_{G,2}$ at the second loop in order to provide an inductance of the second loop higher than the inductance of the first loop and mitigate the effect of the global magnetic field noise.

According to one example, the Josephson junction is a lithographically patterned superconducting-semiconducting planar Josephson junction. For example, the junction may be provided as aluminium (Al) on top of an indium arsenide (InAs) quantum well on an indium phosphide (InP) substrate.

According to one example, the Josephson junction is a superconducting-semiconducting vapor-liquid solid nanowire Josephson junction. For example, the junction may be provided as an InAs nanowire with Al shell.

According to one example, the Josephson junction is a selective area grown semiconductor structure with evaporated superconductor.

According to one example, the Josephson junction is a Graphene Josephson junction.

According to one example, the Josephson junction is a multi-terminal Josephson junction.

According to one example, the Josephson junction is a Josephson junction based on ferromagnetic materials.

According to one example, the Josephson junction is an atomic break junction.

According to one example, the inductor of the second superconducting loop comprises an array of superconducting-semiconducting planar Josephson junctions in a two-dimensional electron gas.

According to one example, the second superconducting loop is configured according to predefined constriction dimensions.

According to one example, the second superconducting loop is adjustable in length.

According to one example, high inductance superconductors are integrated into the second superconducting loop.

The qubit device according to the present subject matter may be compatible with the concept and readout technique of Andreev type qubits. According to one example, the qubit device is an Andreev-type qubit device. This example may enable an Andreev-type qubit design that is resilient to global magnetic field noise and compatible with building large scale quantum processors. It may particularly enable qubits which utilize the advantages of Andreev-type qubits with a longer potential coherence time (compatible with quantum memory and storage), with a compatibility with existing superconducting qubit architectures and with topologically protected states from devices with novel Andreev bound state spectra. This example may further be advantageous as Andreev qubits may be better protected against decoherence than other flux-tunable qubits, so could become an important ingredient in quantum processors.

According to one example, the first supercomputing loop is a radio frequency Superconducting Quantum Interference Device (RF-SQUID) loop. The operating frequency of the qubit device may depend on the magnetic flux through this loop. The operating frequency of the qubit device may be tuned by controlling the effect of an external magnetic field that provides the magnetic flux in the loop.

The present qubit device may further be advantageous as it may seamlessly be integrated in an asymmetric gradiometer design.

FIG. 1 depicts a circuit diagram showing an equivalent circuit for a qubit device 100 according to an example of the present subject matter. The example qubit device 100 represented in FIG. 1 includes a first superconducting loop 101 and a second superconducting loop 102. The first superconducting loop 101 comprises a Josephson junction 105. The first superconducting loop 101 may be inductively coupled to a readout resonator 109 and inductively coupled to control lines 107. The control lines 107 may, for example, comprise a qubit drive line. The qubit drive line may be used to modify the state of the Josephson junction 105 or to tune the number of Andreev bound states in the Josephson junction 105 by applying a microwave drive pulse with a center frequency that matches the operating frequency of the qubit device 100. The control lines 107 may further comprise a flux control line. The flux control line may be used to dynamically tune the operating frequency of the qubit device 100 or tune the phase across the Josephson junction 105. The state of the Josephson junction 105 may be monitored via microwave transmission measurements made between the readout ports of the readout resonator 109. The second superconducting loop 102 comprises an inductor 110 in parallel with the Josephson junction 105.

The first superconducting loop 101 may enclose a magnetic flux $\Phi_1$. For example, when the first superconducting loop 101 is put in an external magnetic field the magnetic flux $\Phi_1$ through the loop may be quantized being equal to the integer number of the flux quanta $\Phi_0$ as follows: $\Phi_1=n_1\Phi_0$. The operation of the first superconducting loop 101 may be based on the fact that the phase difference around the first superconducting loop may be an integral product of $2e\Phi_1/\hbar$, e being the electron charge and $\hbar$ is the Planck constant. The current may vary with $\Phi_1$ and has maxima at $$\frac{e\Phi_1}{\hbar} = \pi n_1.$$

The Josephson junction 105 may have an inductance referred to as $L_q$. The first superconducting loop 101 may have an inductance (first inductance) $L_1$. The first superconducting loop 101 may have an area referred to as $A_1$.

The second superconducting loop 102 may enclose a magnetic flux $\Phi_2$. For example, when the second superconducting loop 102 is put in an external magnetic field, the magnetic flux $\Phi_2$ through the loop may be quantized being equal to the integer number of the flux quanta $\Phi_0$ as follows: $\Phi_2=n_2\Phi_0$. The operation of the second superconducting loop 102 may be based on the fact that the phase difference around the first superconducting loop may be an integral product of $2e\Phi_2/\hbar$, e being the electron charge and $\hbar$ is the Planck constant. The current may vary with $\Phi_2$ and has maxima at $$\frac{e\Phi_2}{\hbar} = \pi n_2.$$

The second superconducting loop 102 may have an inductance (second inductance) referred to as $L_2$. The second superconducting loop 102 may have an area referred to as $A_2$.

Figure 2:
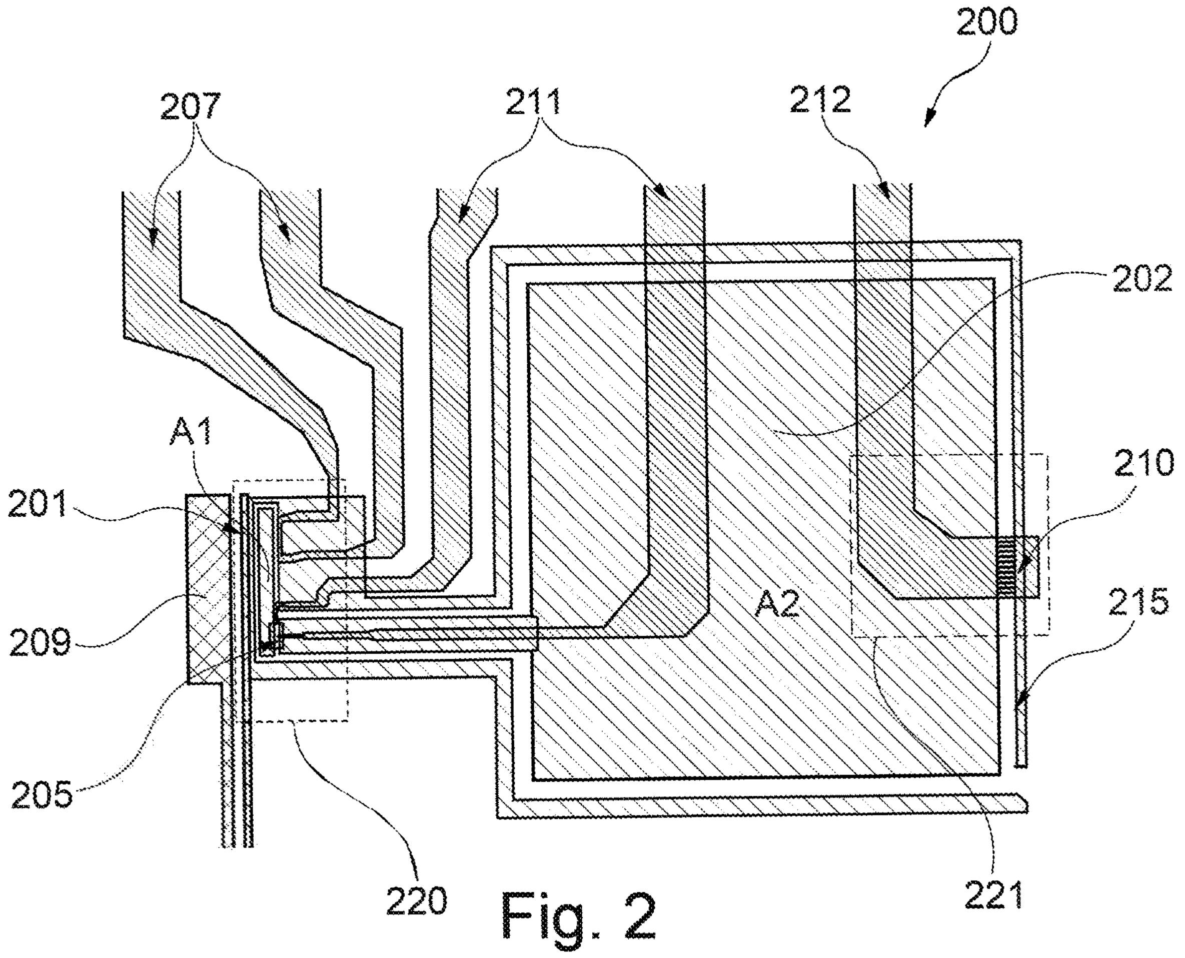
FIG. 2 shows a zoomed-in top view of a chip design that includes a qubit device according to the present subject matter.
Figure 3:
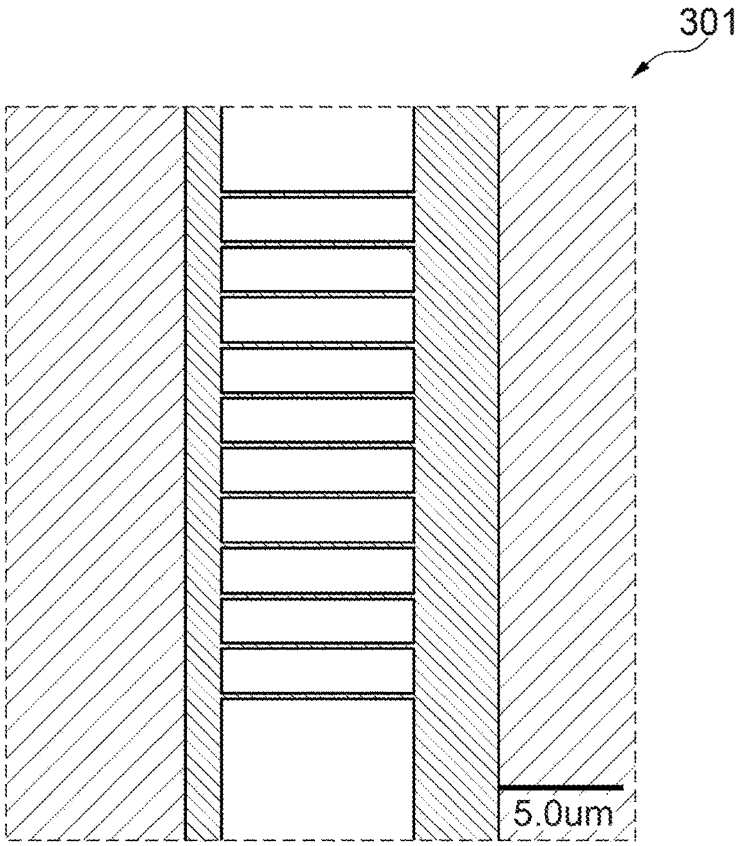
FIG. 3 shows images of portions of a second superconducting loop according to an example of the present subject matter.
Figure 3:
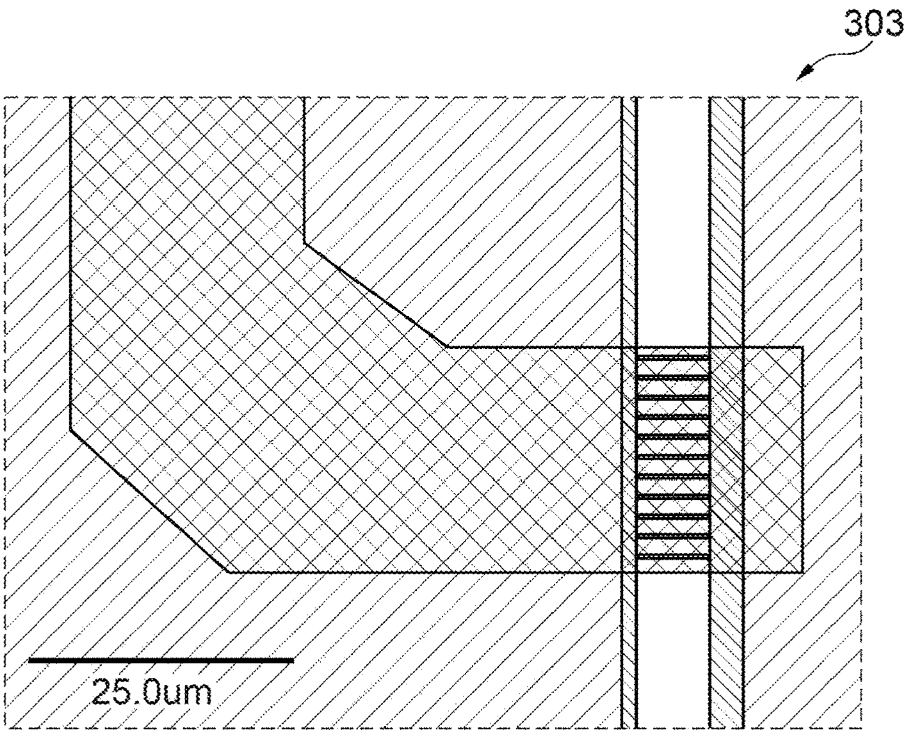

FIG. 2 shows a zoomed-in top view of a chip design that includes a qubit device 200 according to an example of the present subject matter. The qubit device 200 comprises a first superconducting loop 201. The qubit device 200 comprises a superconductor 215. The first superconducting loop 201 may, for example, be a RF-SQUID. The first superconducting loop 201 may comprise a Josephson junction 205. The first superconducting loop 201 is coupled to a microwave readout resonator 209. The first superconducting loop 201 is coupled to control lines 207, 211 and 212. The control lines 207 may enable local flux control to tune the phase across the Josephson junction 205. The control lines 211 may enable electrostatic gate control to tune the number of Andreev bound states in the Josephson junction 205. The qubit device 200 further comprises a second conducting loop 202. The second superconducting loop 202 comprises an inductor (superinductor) 210. The second superconducting loop 202 may be coupled to the control lines 212 that enable electrostatic gate control of the second superconducting loop 202. The inductor 210 may comprise an array of superconductor-semiconductor Josephson junctions. The control lines 212 may tune the number of Andreev bound states in the Josephson junctions of the inductor 210. The image 301 of this inductor 210 is shown in FIG. 3. FIG. 3 further shows an image 303 of a portion 221 of FIG. 2 surrounding the inductor 210.

Figure 4:
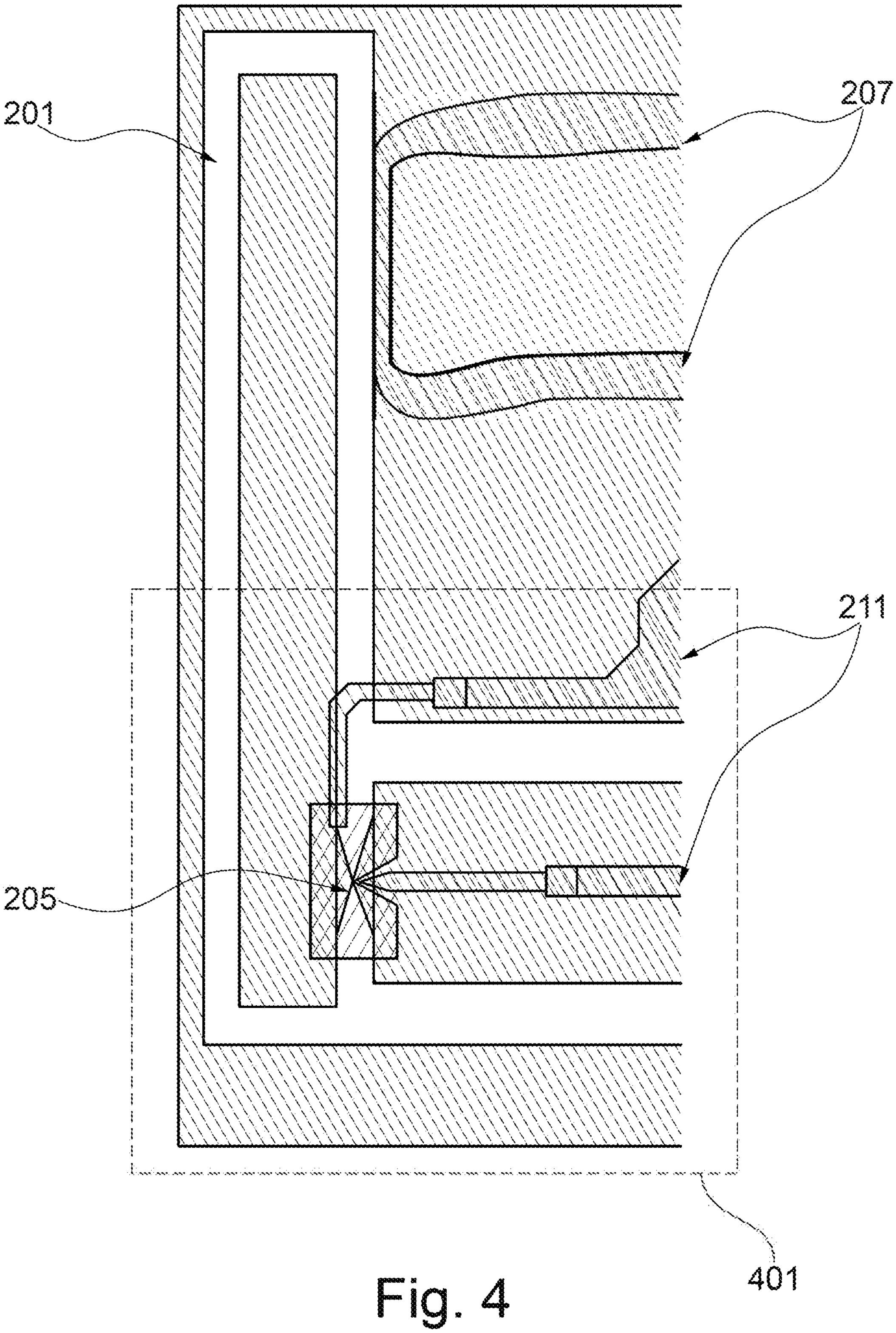
FIG. 4 shows a zoomed-in top view of a chip design that includes a portion of the first superconducting loop in a qubit device according to the present subject matter.
Figure 5:
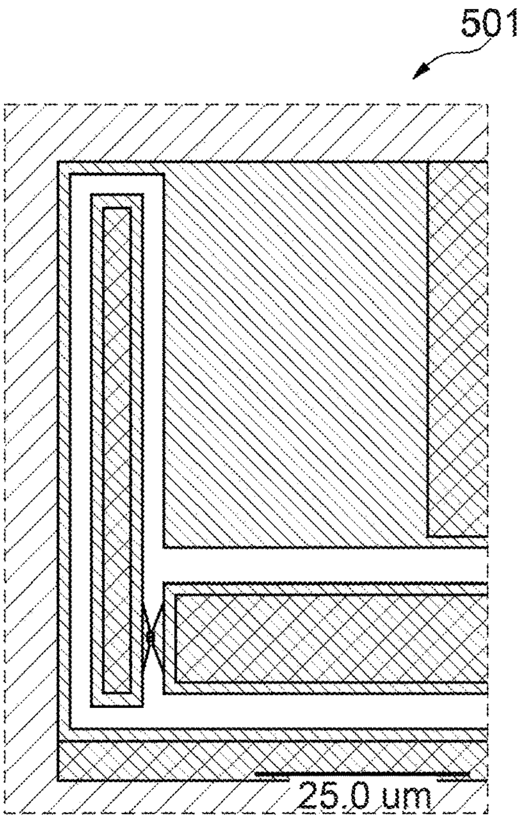
FIG. 5 shows images of portions of a first superconducting loop according to an example of the present subject matter.
Figure 5:
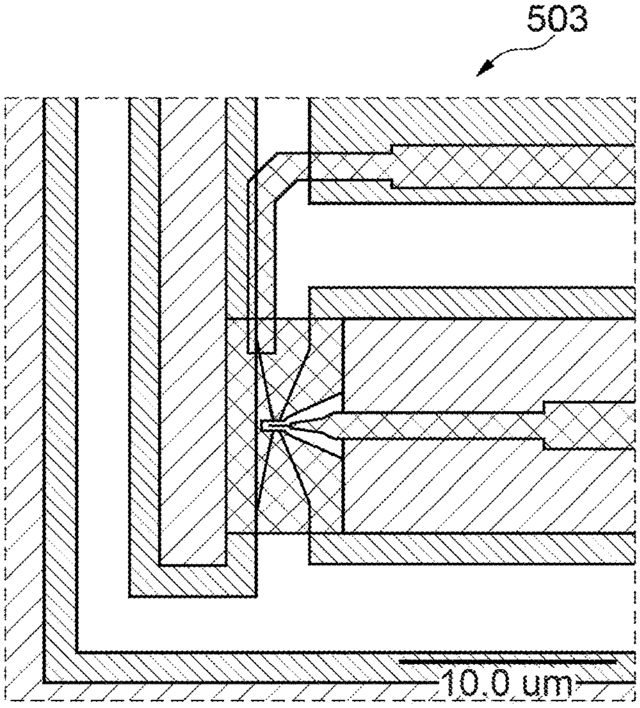

FIG. 4 shows a zoomed-in top view of a chip that includes a first superconducting loop of a qubit device according to an example of the present subject matter. In particular, FIG. 4 shows a zoomed-in view of the portion 220 of FIG. 2. FIG. 4 shows a zoomed-in view of the first superconducting loop 201 that couples inductively to the microwave resonator. FIG. 4 further shows a zoomed-in view of the control lines 207 and 211. The control lines 207 may enable local flux control to tune the phase across the weak link of the Josephson junction 205. The control lines 211 may enable a gate control to tune the number of Andreev bound states in the Josephson junction 205. FIG. 5 shows an image 503 of the portion 401 of FIG. 4 and an image 501 which is a zoom-out of the image 503 and represents the whole view of FIG. 4.

In one aspect the invention relates to a computer program product comprising a computer-readable storage medium having computer-readable program code embodied therewith, the computer-readable program code configured to implement the analytical computation and/or the simulation method.

Computing environment 800 contains an example of an environment for the execution of at least some of the computer code involved in performing the inventive methods, such as qubit device's analytical calculation code 900. In addition to block 900, computing environment 800 includes, for example, computer 801, wide area network (WAN) 802, end user device (EUD) 803, remote server 804, public cloud 805, and private cloud 806. In this embodiment, computer 801 includes processor set 810 (including processing circuitry 820 and cache 821), communication fabric 811, volatile memory 812, persistent storage 813 (including operating system 822 and block 900, as identified above), peripheral device set 814 (including user interface (UI), device set 823, storage 824, and Internet of Things (IoT) sensor set 825), and network module 815. Remote server 804 includes remote database 830. Public cloud 805 includes gateway 840, cloud orchestration module 841, host physical machine set 842, virtual machine set 843, and container set 844.

Figure 6:
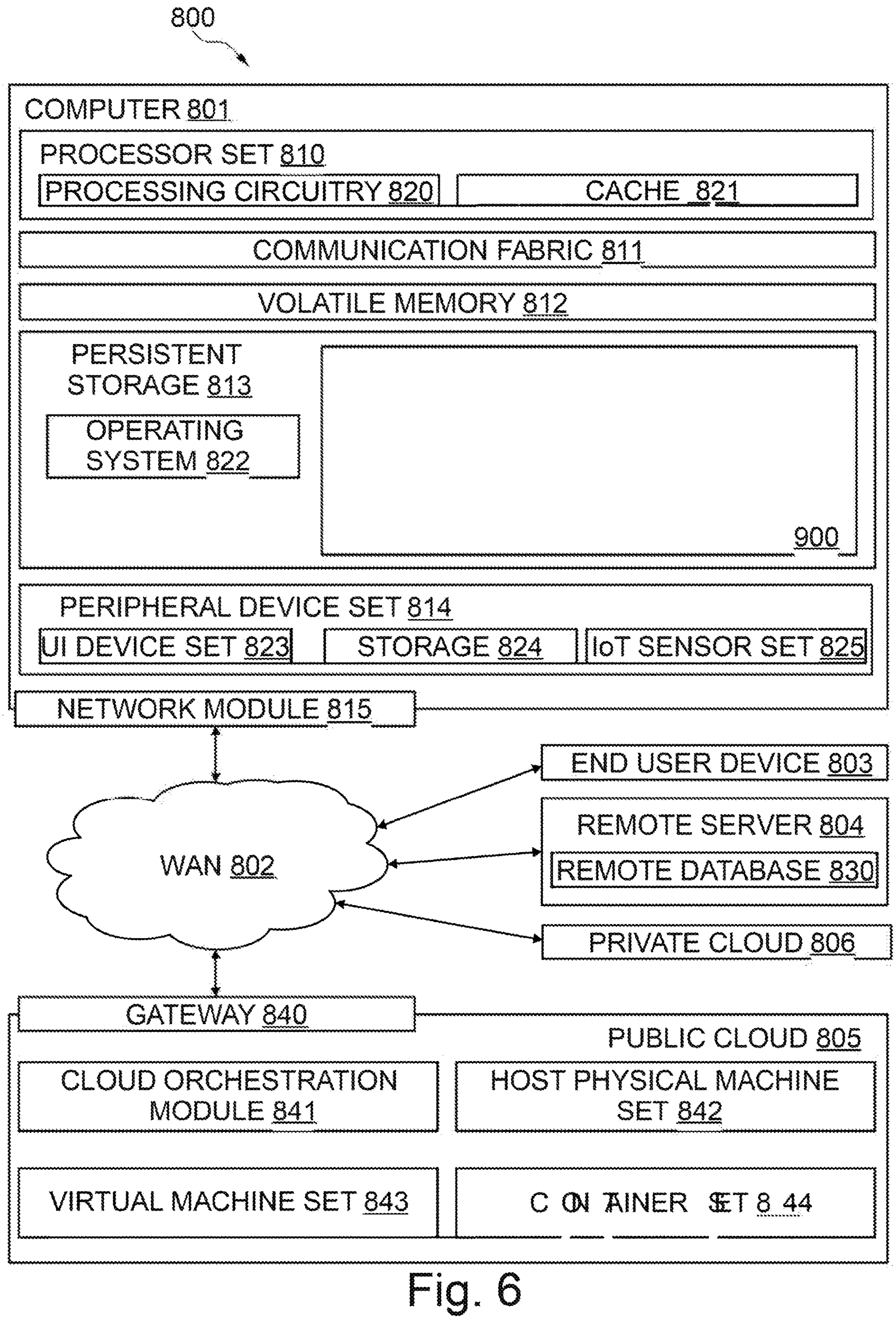
FIG. 6 is a computing environment for performing analytical computations according to an example of the present subject matter.

COMPUTER 801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 830. As is well understood in the art of computer technology, and depending upon the technology, performance of a computer-implemented method may be distributed among multiple computers and/or between multiple locations. On the other hand, in this presentation of computing environment 800, detailed discussion is focused on a single computer, specifically computer 801, to keep the presentation as simple as possible. Computer 801 may be located in a cloud, even though it is not shown in a cloud in FIG. 6. On the other hand, computer 801 is not required to be in a cloud except to any extent as may be affirmatively indicated.

PROCESSOR SET 810 includes one, or more, computer processors of any type now known or to be developed in the future. Processing circuitry 820 may be distributed over multiple packages, for example, multiple, coordinated integrated circuit chips. Processing circuitry 820 may implement multiple processor threads and/or multiple processor cores. Cache 821 is memory that is located in the processor chip package(s) and is typically used for data or code that should be available for rapid access by the threads or cores running on processor set 810. Cache memories are typically organized into multiple levels depending upon relative proximity to the processing circuitry. Alternatively, some, or all, of the cache for the processor set may be located "off chip." In some computing environments, processor set 810 may be designed for working with qubits and performing quantum computing.

Computer readable program instructions are typically loaded onto computer 801 to cause a series of operational steps to be performed by processor set 810 of computer 801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 821 and the other storage media discussed below. The program instructions, and associated data, are accessed by processor set 810 to control and direct performance of the inventive methods. In computing environment 800, at least some of the instructions for performing the inventive methods may be stored in block 900 in persistent storage 813.

COMMUNICATION FABRIC 811 is the signal conduction paths that allow the various components of computer 801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 812 is any type of volatile memory now known or to be developed in the future. Examples include dynamic type random access memory (RAM) or static type RAM. Typically, the volatile memory is characterized by random access, but this is not required unless affirmatively indicated. In computer 801, the volatile memory 812 is located in a single package and is internal to computer 801, but, alternatively or additionally, the volatile memory may be distributed over multiple packages and/or located externally with respect to computer 801.

PERSISTENT STORAGE 813 is any form of non-volatile storage for computers that is now known or to be developed in the future. The non-volatility of this storage means that the stored data is maintained regardless of whether power is being supplied to computer 801 and/or directly to persistent storage 813. Persistent storage 813 may be a read only memory (ROM), but typically at least a portion of the persistent storage allows writing of data, deletion of data and re-writing of data. Some familiar forms of persistent storage include magnetic disks and solid-state storage devices. Operating system 822 may take several forms, such as various known proprietary operating systems or open-source Portable Operating System Interface type operating systems that employ a kernel. The code included in block 900 typically includes at least some of the computer code involved in performing the inventive methods.

PERIPHERAL DEVICE SET 814 includes the set of peripheral devices of computer 801. Data communication connections between the peripheral devices and the other components of computer 801 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 823 may include components such as a display screen, speaker, microphone, wearable devices (such as goggles and smart watches), keyboard, mouse, printer, touchpad, game controllers, and haptic devices. Storage 824 is external storage, such as an external hard drive, or insertable storage, such as an SD card. Storage 824 may be persistent and/or volatile. In some embodiments, storage 824 may take the form of a quantum computing storage device for storing data in the form of qubits. In embodiments where computer 801 is required to have a large amount of storage (for example, where computer 801 locally stores and manages a large database) then this storage may be provided by peripheral storage devices designed for storing very large amounts of data, such as a storage area network (SAN) that is shared by multiple, geographically distributed computers. IoT sensor set 825 is made up of sensors that can be used in Internet of Things applications. For example, one sensor may be a thermometer and another sensor may be a motion detector.

NETWORK MODULE 815 is the collection of computer software, hardware, and firmware that allows computer 801 to communicate with other computers through WAN 802. Network module 815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 815 are performed on the same physical hardware device. In other embodiments (for example, embodiments that utilize software-defined networking (SDN)), the control functions and the forwarding functions of network module 815 are performed on physically separate devices, such that the control functions manage several different network hardware devices. Computer readable program instructions for performing the inventive methods can typically be downloaded to computer 801 from an external computer or external storage device through a network adapter card or network interface included in network module 815.

WAN 802 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 803 is any computer system that is used and controlled by an end user (for example, a customer of an enterprise that operates computer 801), and may take any of the forms discussed above in connection with computer 801. EUD 803 typically receives helpful and useful data from the operations of computer 801. For example, in a hypothetical case where computer 801 is designed to provide a recommendation to an end user, this recommendation would typically be communicated from network module 815 of computer 801 through WAN 802 to EUD 803. In this way, EUD 803 can display, or otherwise present, the recommendation to an end user. In some embodiments, EUD 803 may be a client device, such as thin client, heavy client, mainframe computer, desktop computer and so on.

REMOTE SERVER 804 is any computer system that serves at least some data and/or functionality to computer 801. Remote server 804 may be controlled and used by the same entity that operates computer 801. Remote server 804 represents the machine(s) that collect and store helpful and useful data for use by other computers, such as computer 801. For example, in a hypothetical case where computer 801 is designed and programmed to provide a recommendation based on historical data, then this historical data may be provided to computer 801 from remote database 830 of remote server 804.

PUBLIC CLOUD 805 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 805 is performed by the computer hardware and/or software of cloud orchestration module 841. The computing resources provided by public cloud 805 are typically implemented by virtual computing environments that run on various computers making up the computers of host physical machine set 842, which is the universe of physical computers in and/or available to public cloud 805. The virtual computing environments (VCEs) typically take the form of virtual machines from virtual machine set 843 and/or containers from container set 844. It is understood that these VCEs may be stored as images and may be transferred among and between the various physical machine hosts, either as images or after instantiation of the VCE. Cloud orchestration module 841 manages the transfer and storage of images, deploys new instantiations of VCEs and manages active instantiations of VCE deployments. Gateway 840 is the collection of computer software, hardware, and firmware that allows public cloud 805 to communicate through WAN 802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 806 is similar to public cloud 805, except that the computing resources are only available for use by a single enterprise. While private cloud 806 is depicted as being in communication with WAN 802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 805 and private cloud 806 are both part of a larger hybrid cloud.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation, or garbage collection, but this does not render the storage device as transitory because the data is not transitory while it is stored.

What is claimed is:

1. A qubit device comprising:
- a first superconducting loop comprising one Josephson junction; and
- a second superconducting loop, wherein the second superconducting loop comprises a second inductor in parallel with the Josephson junction and having an inductance higher than an inductance of the first superconducting loop.

2. The qubit device of claim 1, the inductance is a kinetic inductance, or a sum of the kinetic inductance and a geometric inductance.

3. The qubit device of claim 1, the second superconducting loop having the inductance higher than the inductance of the first superconducting loop by a predefined offset value.

4. The qubit device of claim 3, the offset value being a function of an inductance of the Josephson junction.

5. The qubit device of claim 1, the second superconducting loop having an area 5. higher than an area of the first superconducting loop.

6. The qubit device of claim 1, the first superconducting loop having a first area and a first inductance, the second superconducting loop having a second area and a second inductance, wherein a ratio of the first area and second area is equal to a ratio of the first inductance and second inductance.

7. The qubit device of claim 1, the first superconducting loop being configured to inductively couple to a readout resonator and/or to inductively couple to control lines.

8. The qubit device of claim 1, the Josephson junction being any one of:
- a lithographically patterned superconducting-semiconducting planar Josephson junction;
- a superconducting-semiconducting vapor-liquid solid nanowire Josephson junction;
- a selective area grown semiconductor structure with evaporated superconductor;
- a Graphene Josephson junction;
- a multi-terminal Josephson junction;
- a Josephson junction based on ferromagnetic materials; and
- an atomic break junction.

9. The qubit device of claim 1, an inductor of the second superconducting loop comprising a tuneable array of superconducting-semiconducting planar Josephson junctions in a two-dimensional electron gas.

10. The qubit device of claim 1, the second superconducting loop being configured according to predefined constriction dimensions.

11. The qubit device of claim 1, the second superconducting loop being adjustable in length.

12. The qubit device of claim 1, wherein high inductance superconductors are integrated into the second superconducting loop.

13. The qubit device of claim 1, the qubit device being an Andreev-type qubit device.

14. A method, comprising:
- performing quantum computing by a qubit device, wherein the qubit device comprises:
  - a first superconducting loop containing one Josephson junction; and
  - a second superconducting loop, wherein the second superconducting loop comprises a second inductor in parallel with the Josephson junction and having an inductance higher than an inductance of the first superconducting loop.

15. The method of claim 14, wherein the second superconducting loop has an inductance higher than an inductance of the first superconducting loop by a predefined offset value.

16. The method of claim 14, further comprising adjusting a kinetic inductance and/or geometric inductance of the second superconducting loop such that the inductance of the second superconducting loop is higher than the inductance of the first superconducting loop by a predefined offset value.

17. The method of claim 14, further comprising performing constriction in the second superconducting loop such that the inductance of the second superconducting loop is higher than an inductance of the first superconducting loop by a predefined offset value.

18. The method of claim 14, wherein the Josephson junction is any one of:
- a lithographically patterned superconducting-semiconducting planar Josephson junction;
- a superconducting-semiconducting vapor-liquid solid nanowire Josephson junction;
- a selective area grown semiconductor structure with evaporated superconductor;
- a Graphene Josephson junction;
- a multi-terminal Josephson junction;
- a Josephson junction based on ferromagnetic materials; and
- an atomic break junction.

19. The method of claim 14, wherein the qubit device is an Andreev-type qubit device.

20. The method of claim 14, further comprising:
- configuring the first superconducting loop to inductively couple to a readout resonator and/or to inductively couple to control lines.

* * * * *